US006967875B2

(12) United States Patent
Chen et al.

(10) Patent No.: US 6,967,875 B2
(45) Date of Patent: Nov. 22, 2005

(54) STATIC RANDOM ACCESS MEMORY SYSTEM WITH COMPENSATING-CIRCUIT FOR BITLINE LEAKAGE

(75) Inventors: Chung-Hao Chen, Chung-Li (TW); Hsin-Pang Lu, Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 267 days.

(21) Appl. No.: 10/419,223

(22) Filed: Apr. 21, 2003

(65) Prior Publication Data

US 2004/0208036 A1 Oct. 21, 2004

(51) Int. Cl.[7] .............................................. G11C 16/04
(52) U.S. Cl. ............. 365/189.08; 365/203; 365/189.11
(58) Field of Search .......................... 365/203, 189.11, 365/189.08, 196

(56) References Cited

U.S. PATENT DOCUMENTS

| 5,751,044 | A | 5/1998 | Lee |
| 5,943,269 | A | 8/1999 | Roberts |
| 6,011,726 | A | 1/2000 | Batson et al. |
| 6,044,011 | A | 3/2000 | Marr et al. |
| 6,091,628 | A | 7/2000 | Kim |
| 6,501,687 | B2 * | 12/2002 | Choi ...................... 365/189.11 |
| 6,707,708 | B1 * | 3/2004 | Alvandpour et al. ........ 365/154 |
| 6,801,463 | B2 * | 10/2004 | Khellah et al. ............. 365/203 |

FOREIGN PATENT DOCUMENTS

GB    2256297 A  * 12/1992  ............ G11C 7/00

OTHER PUBLICATIONS

K. Noda et al. "A 1.9-$\mu m^2$ Loadless CMOS Four-Transistor SRAM Cell in a 0.18$\mu$m Logic Technology" 1998 IEEE, IEDM 98 pgs. 643-646, 22.8.1-22.8.4.

* cited by examiner

*Primary Examiner*—Anh Phung
*Assistant Examiner*—Toan Le
(74) *Attorney, Agent, or Firm*—Arent Fox PLLC (57) ABSTRACT

The memory system includes a plurality of memory cells that are arranged for forming a column, and the plurality of memory cells are coupled with a first bitline and a second bitline individually. Additionally, the memory system further includes a bitline conditioning circuit to perform the pre-charge procedure thereof; and that includes a plurality of wordlines. Furthermore, the memory system further includes a compensating-circuit to keep the voltage that is requirement for the access procedure, wherein the bitline conditioning circuit and the compensating-circuit couple to receive a pair of complemental signals so as to control the interaction between the pre-charge procedure and the compensation procedure from each other.

17 Claims, 5 Drawing Sheets

STATIC RANDOM ACCESS MEMORY SYSTEM WITH COMPENSATING-CIRCUIT FOR BITLINE LEAKAGE

BACKGROUND OF THE INVENTION

1. Field of the Invention

The present invention relates generally to a static random access memory(SRAM)system, and more particularly to a static random access memory system with a compensating-circuit.

2. Description of the Prior Art

As semiconductor devices, such as the Metal-Oxide-Semiconductor device, become highly integrated the area occupied by the device shrinks, as well as the design rule. With advances in the semiconductor technology, the dimensions of the integrated circuit (IC) devices have shrunk to the deep sub-micron range. When the semiconductor device continuously shrinks in the deep sub-micron region, some problems described below are incurred due to the scaling down process. To meet customer demand for small size and low power products, manufacturers are producing newer integrated circuits (ICs) that operate with lower supply voltages and that include smaller internal sub-circuits. Many ICs, such as memory circuits or other circuits such as microprocessors that include onboard memory, include one or more SRAM cells for data storage. SRAMs cells are popular because they operate at a higher speed than dynamic random-access-memory (DRAM) cells, and as long as they are powered, they can store data indefinitely, unlike DRAM cells, which must be periodically refreshed.

Static random access memory (SRAM) cells typically provide memory storage for bits that can be rapidly read from and written to. Conventional structure of Static random access memory (SRAM) cell is a six-transistors SRAM cell, which means six transistors are used to form a SRAM cell. In general, advantages of six-transistors SRAM cell at least include high speed and possibility of low supply voltage. By unfortunately, one unavoidable disadvantage is that area of six-transistor SRAM cell is large, and the disadvantage is more serious and it is desired to overcome the disadvantage by either improving structure of six-transistors SRAM cell or providing a new SRAM cell. Therefore, four-transistors SRAM is present to replace the conventional six-transistors SRAM cell. Clearly, owing to number of used transistor is decreased, occupied area of four-transistors SRAM cell is less than six-transistors SRAM cell. Thus, four-transistors SRAM cell is more suitable for ICs whenever sizes of ICs are reduced, even four-transistors also meets some disadvantages such as higher off-state leakage current of PMOS. More introduction of four-transistors SRAM cell can be acquired by referring to IEEE IEDM 98-643 to IEDM 98-646, U.S. Pat. No. 5,943,269, U.S. Pat. No. 6,091,628, U.S. Pat. No. 6,044,011, U.S. Pat. No. 6,011,726, U.S. Pat. No. 5,751,044.

In a typical SRAM cell having six field effect transistors (FET transistors), there are a first inverter formed by two of the FET transistors and a second inverter formed by other two of the FET transistors between power and ground terminals. The first and second inverters are cross-coupled such that at a first storage node, the output of the second inverter is tied to the input of the first inverter, and at a second storage node, the output of the first inverter is tied to the input of the second inverter. The first and second cross-coupled inverters form latched wherein one of the storage nodes is pulled low and the other storage node is pulled high. The other two of the six transistors are pass FET transistors controlled by a wordline signal on a wordline conductor. One of the pass transistors is coupled between a bitline and the first storage node. The other pass transistor is coupled between a bitline# and the second storage node. With the pass transistors off, the first and second storage nodes are insulated from the bitline and bitline#, although there may be some leakage.

In a reading procedure, data and data# signals are pre-charged high on the bitline and bitline#, respectively. When the wordline is asserted, one of the storage nodes is low and the other is high. The low storage node begins to pull either the data or data# signal low depending on the state of the memory cell. A sense amplifier senses a difference between the data and data# signals and accelerates the fall of whichever of the data or data# signals corresponds to the low storage node until the storage node is low. The high storage node remains high and the sense amplifier may pin the storage node high through the data or data# signal (depending on the state of the memory cell). Accordingly, the reading procedure causes the storage nodes to remain at the same logic states after the wordline signal is de-asserted. The sense amplifier provides a signal indicative of the state.

In a writing procedure, circuitry in a sense amplifier causes one of the data or data# signals to be high and the other to be low in response to whether a high or low value has been written into a write buffer. When the wordline signal is asserted, if the current state of the first and second storage nodes is the same as that of the data and data# signals, the first and second storage nodes remains the same. If the current state of the first and second storage nodes is different than that of the data and data# signals, one of the storage nodes is pulled down while the other storage node is pulled up. When the states of the first and second storage nodes in the latch formed of the two cross-coupled inverters changes, the latch is said to flip states. Unlike dynamic random access memory (DRAM) cells, SRAM cells are not required to be refreshed to maintain their state. Rather, as long as the power is supplied to the power terminal and absent leakage, the voltage states of the first and second storage nodes are stable in the latch of the cross-coupled inverters.

Figure 1:
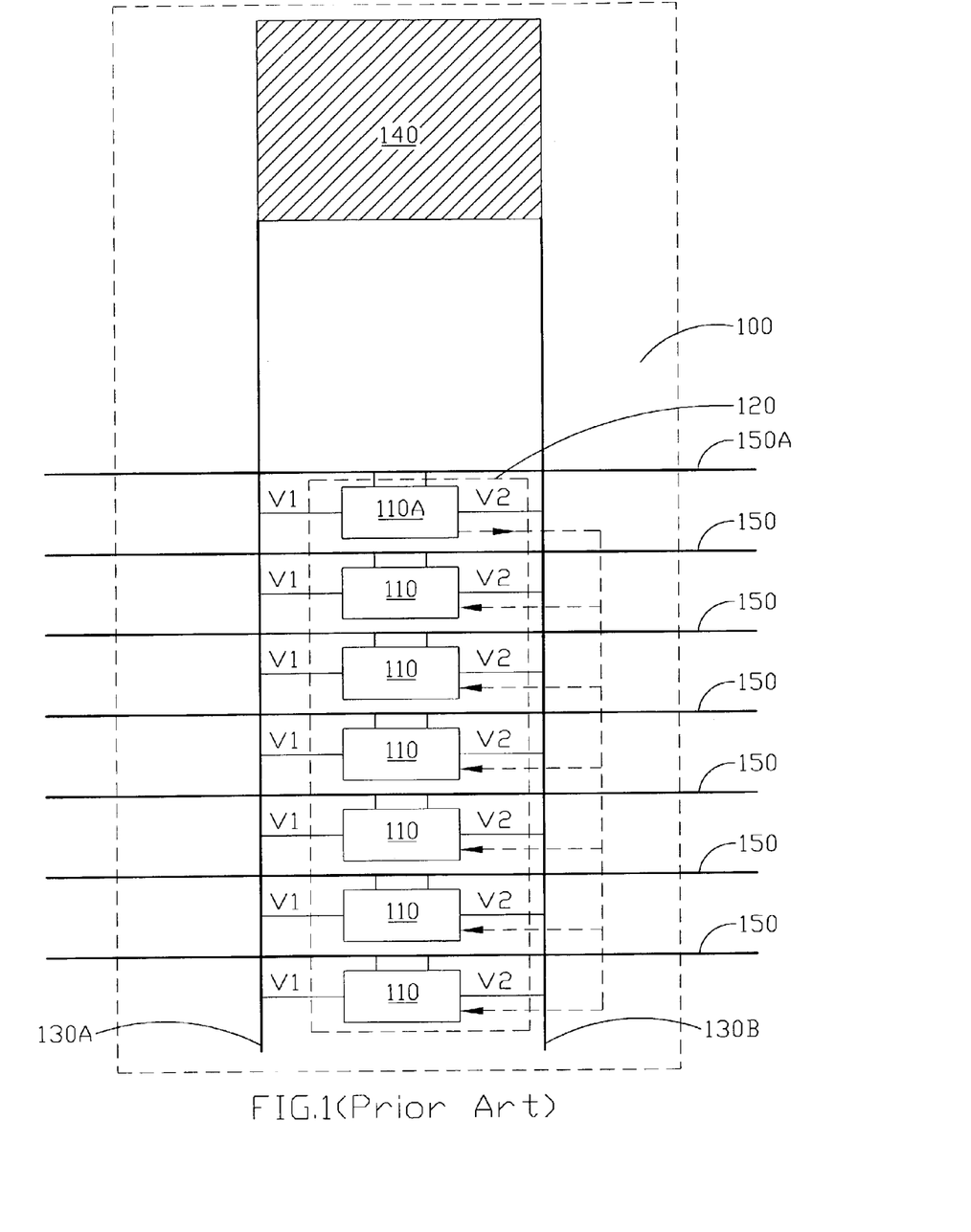
FIG. 1 shows a circuitry of the conventional static random access memory (SRAM) system without compensating-circuit.

As CMOS process technology progresses, the increasing leakage current is becoming critical and acts as a noise source for sense amplifier of memory. In the conventional SRAM, the increased bitline leakage current will induce read/write incorrect operation. The conventional SRAM leakage problem is shown below FIG. 1, memory system 100 includes a column 120 with a plurality of memory cells 110, wherein the column 120 is formed by a plurality of memory cells 110 coupled with a first bitline 130A and a second bitline 130B; a Bitline conditioning circuit 140 is coupled with the first bitline 130A and the second bitline 130B to precharge the first bitline 130A and the second, bitline 130B, individually; each memory cell 110 is coupled with a wordline 150 and each wordline 150 is also coupled with the first bitline 130A and the second bitline 130B, individually. As shown in FIG. 1, it schematically illustrates a first state V1 and a second state V2 of each memory cell 110 in the column 120.

First of all, the Bitline conditioning circuit 140 performs a pre-charge operation to make the first state V1 becomes one (V1=1) and the second state V2 becomes zero(V2=0)of every memory cell 110, that is, the first state is higher than the second state of every memory cell 110. If the first wordline 150A is selected to perform a read/write procedure and other wordlines 150 are not selected, the first wordline 150A will be ON to make the first state V1 become zero (V1=0) and the second state V2 become one (V2=1) in the first memory cell 110A, but the first state V1 becomes one (V1=1) and the second state V2 becomes zero (V2=0) in other memory cells 110, that is, in which for the first memory cell 110A, the first state V1 is lower and the second state V2 is higher, but for other memory cells 110, the first state V1 is higher and the second state V2 is lower. It will result in leakage with respect to the second bitline 130B and the second state V2 of all memory cells 110 will tend to balance. If amount of the memory cells 110 in the column 120 is larger more and more, the second state V2 of the first memory cell 110A will be becoming lower due to the leakage issue, and further, the leakage of the second bitline 130B on the first memory cell 110A is increased as time. When a normal access (read/write) operation happens, the second state V2 of the first memory cell 110A will be becoming "0" from "1" due to the leakage issue, and hence, that will be erroneous judgement to form "error".

To keep leakage low, the threshold voltages have to be kept relatively high in the conventional SRAM process, and the threshold voltages of transistors of the memory cells may be higher than for transistors of other portions of the integrated circuits containing the memory cells. However, keeping the threshold voltage high also decreases the switching speed and effects cache performance thereof. For forming the SRAM process, this method that utilizes adjusting the threshold voltage in the SRAM process is difficult to be performed, and it also increases the process costs. In accordance with the above description, a new and improved method and the structure thereof for preventing the leakage in SRAM is therefore necessary in the deep sub-micron technology of semiconductors, so as to raise the performance of SRAM.

SUMMARY OF THE INVENTION

In accordance with the present invention, a method is provided that substantially overcomes the drawbacks of the above mentioned problems to avoid bitline leakage in SRAM.

Accordingly, it is one of objects in the present invention to provide a compensation circuit to compensate the bitlines leakage of SRAM. This invention can utilize a compensation circuit coupled with the SRAM to self-compensate bitlines leakage issue caused during read/write operation. Furthermore, the present invention can solve the issue of error judgment that is caused by voltage decay of bitlines resulted from this leakage problem of SRAM by a circuitry point of view, and thus it need not modify any special requirement in the process for forming the SRAM due to this circuitry point of view. Therefore, this invention can reduce the costs of the conventional process and hence correspond to economic effect.

Another object of the present invention is to provide a SRAM system with a compensation circuit for detecting the differential voltage level of bitlines by itself and compensate the leakage thereof. This invention couples a compensation circuit schemed by cross-coupling with a pair of symmetric sub-circuits with the SRAM, so as to detect the differential voltage level of bitlines by itself and compensate the voltage of bitlines immediately. When the abnormal voltage level of bitlines is detected, and one of the symmetric sub-circuits in the compensation circuit compensates to Vcc immediately.

Another object of the present invention is to provide a SRAM system with a compensation circuit. This invention utilizes a pair of complementary signals to simultaneously communicate the compensation circuit and the memory circuit coupled with that, so as to control the interaction between the compensation circuit and the memory circuit by way of the complementary signals. Furthermore, this invention also utilizes the pair of complementary signals to perform a new operational procedure of SRAM system, comprises: a pre-charge procedure, an access procedure and a compensating procedure.

In accordance with the purposes of the present invention, a new static random access memory system with a compensation circuit for bitlines leakage is disclosed. The memory system comprises a plurality of memory cells that are arranged for forming a column, and the plurality of memory cells are coupled with a first bitline and a second bitline individually; and further, the same bitline is located on the same side of the plurality of memory cells. Additionally, the memory system further comprises a bitline conditioning circuit that is coupled with the first bitline and the second bitline individually, so as to perform the pre-charge procedure thereof; and that comprises a plurality of wordlines, wherein each wordline is coupled with the first bitline and the second bitline individually. Furthermore, the memory system further comprises a compensating-circuit that is individually coupled with the first bitline and the second bitline between the first memory cell and the bitline conditioning circuit to keep the voltage that is requirement for the access procedure, wherein the bitline conditioning circuit and the compensating-circuit couple to receive a pair of complementary signals so as to control the interaction between the pre-charge procedure and the compensation procedure from each other.

First of all, a first complemental signal couples to enable to proceed with the pre-charge procedure so that the first state is higher than the second state in all memory cells, wherein a second complemental signal simultaneously coupled to disable to the compensating-circuit. If the first wordline belonged to the first memory cell is selected to proceed with the access procedure and other wordlines are not selected, the first wordline will be ON to make the first state to be lower than the second state in the first memory cell for performing the access procedure of the first memory cell, in which for the other memory cells, the first state is higher than the second state. The first complemental signal is coupled to enable the compensating-circuit so as to proceed with a compensation procedure during the access procedure of the first memory cell, and the second complemental signal is simultaneously coupled to disable to the bitline conditioning circuit, wherein the compensating-circuit is ON by itself to keep the second state of the first memory cell is higher than that of others, whereby the problems resulted from leakages of SRAM during the access procedure is avoided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 2:
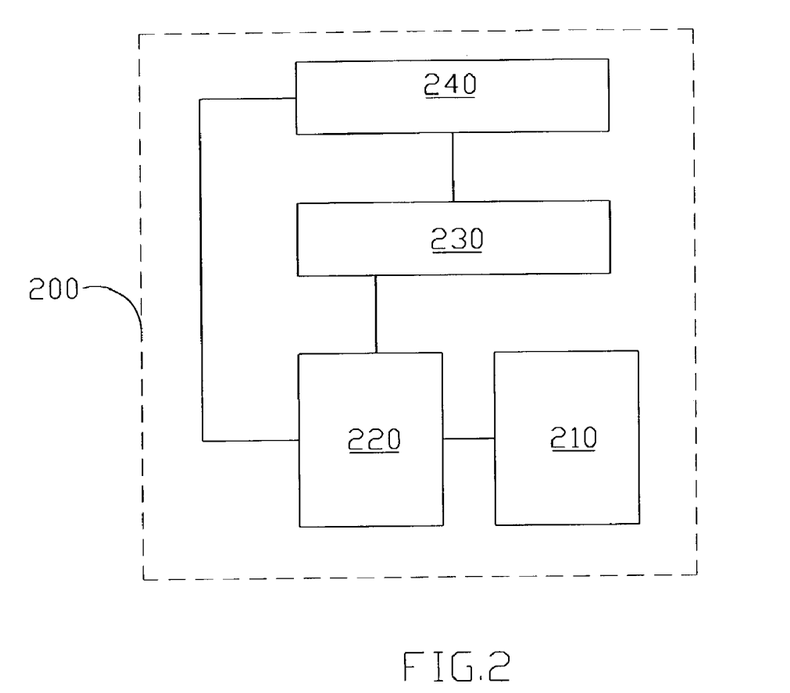
FIG. 2 shows a circuitry of the memory system that can keep Vcc for operating memory cell in accordance with the first embodiment of the present invention.

As illustrated in FIG. 2, in the first embodiment of the present invention, first of all, a memory system 200 is provided. The memory system 200 comprises: a memory cell region 210 that are coupled with at least one bitline region 220; a first sub-circuit 230 that is coupled with at least one bitline region 220; a second sub-circuit 240 that is coupled with at least one bitline region 220, wherein the first sub-circuit 230 and the second sub-circuit 240 can keep Vcc that is necessary for operating the memory cell region 210 by coupling to proceed with the interaction; and further, the interaction is that the second sub-circuit 240 is enabled when the first sub-circuit 230 is disabled, and the second sub-circuit 240 is disabled when the first sub-circuit 230 is enabled.

Referring to FIG. 2, in this embodiment, the operation of the memory system 200 is described as followings: first of all, the memory system 200 is coupled to enable the first sub-circuit 230 and simultaneously disable the second sub-circuit 240 so as to perform a pre-charge procedure, whereby the first sub-circuit 230 drives at least one bitline region 220 to make the memory cell region 210 to attain Vcc; After the memory cell region 210 attains Vcc, the memory system 200 is coupled to disable the first sub-circuit 230 to proceed with an access procedure, and the memory system 200 is coupled to enable the second sub-circuit 240 to proceed with a compensation procedure, wherein the memory system 200 can control the pre-charge procedure and the compensation procedure by the interaction between the first sub-circuit 230 and the second sub-circuit 240. When Vcc of the memory cell region 210 is not enough to operate due to the leakage, the second sub-circuit 240 drives at least one bitline region 220 via the compensation procedure so as to keep Vcc for operating the memory cell region 210.

Figure 3:
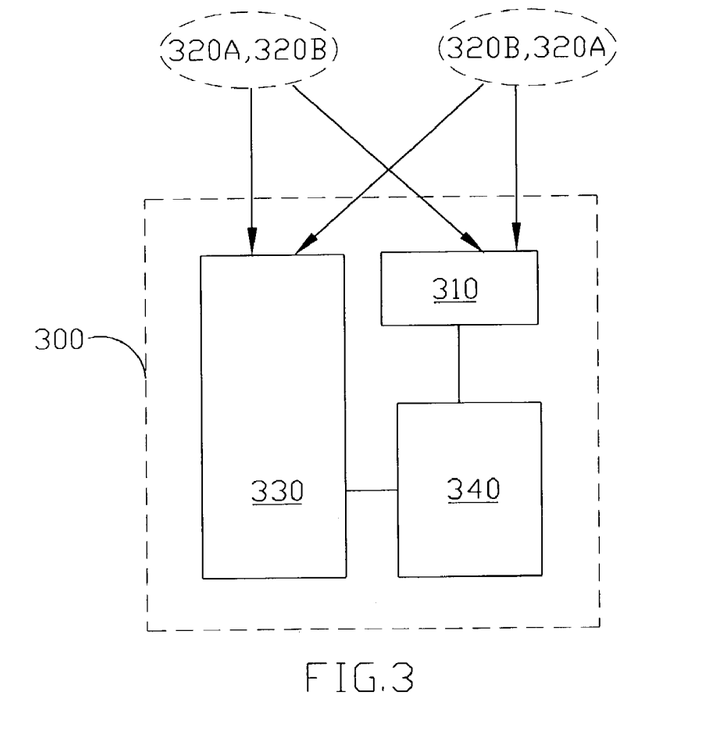
FIG. 3 shows a circuitry of the memory system that can keep Vcc needed during the access procedure in accordance with the second embodiment of the present invention.

As illustrated in FIG. 3, in the second embodiment of the present invention, first of all, a memory system 300 is provided. The memory system 300 comprises: a first sub-circuit 310, a first signal 320A is coupled to enable the first sub-circuit 310 and a second signal 320B is coupled to disable the first sub-circuit 310, wherein the first signal 320A and the second signal 320B pair to form complementary signals from each other that the first signal 320A is ON and the second signal 320B is OFF; a second sub-circuit 330, the first signal 320A is coupled to enable the second sub-circuit 330 when the second signal 320B is coupled to disable the first sub-circuit 310, and the second signal 320B is coupled to disable the second sub-circuit 330 when the first signal 320A is coupled to enable the first sub-circuit 310, wherein the first signal 320A and the second signal 320B are simultaneously communicated with the first sub-circuit 310 and the second sub-circuit 330, individually, so as to perform a interaction between the first sub-circuit 310 and the second sub-circuit 330, that is, when the first signal 320A is coupled to enable the first sub-circuit 310, the second signal 320B is coupled to disable the second sub-circuit 330; and further, when the second signal 320B is coupled to disable the first sub-circuit 310, the first signal 320A is coupled to enable the second sub-circuit 330; a third sub-circuit 340, the third circuit 340 is individually coupled with the first sub-circuit 310 and the second sub-circuit 330, wherein the third sub-circuit 340 can keep Vcc for operating that via the interaction between the first sub-circuit 310 and the second sub-circuit 330.

Referring to FIG. 3, in this embodiment, the operation of the memory system 300 is described as followings: first of all, the memory system 300 is coupled to enable the first sub-circuit 310 by the first signal 320A to proceed with a pre-charge procedure and simultaneously disable the second sub-circuit 330 by the second signal 320B, so as to make the third sub-circuit 340 to Vcc. After the third sub-circuit 340 attains Vcc, the memory system 300 is coupled to disable the first sub-circuit 310 by the second signal 320B to proceed with an access procedure, and the memory system 300 is coupled to enable the second sub-circuit 330 by the first signal 320A to proceed with a compensation procedure, wherein the memory system 300 can control the pre-charge procedure and the compensation procedure by the interaction between the first sub-circuit 310 and the second sub-circuit 330. When Vcc of the third sub-circuit 340 is not enough to operate due to the leakage, the memory system 300 drives the second sub-circuit 330 via the compensation procedure so as to keep Vcc for operating the third sub-circuit 340.

Figure 4:
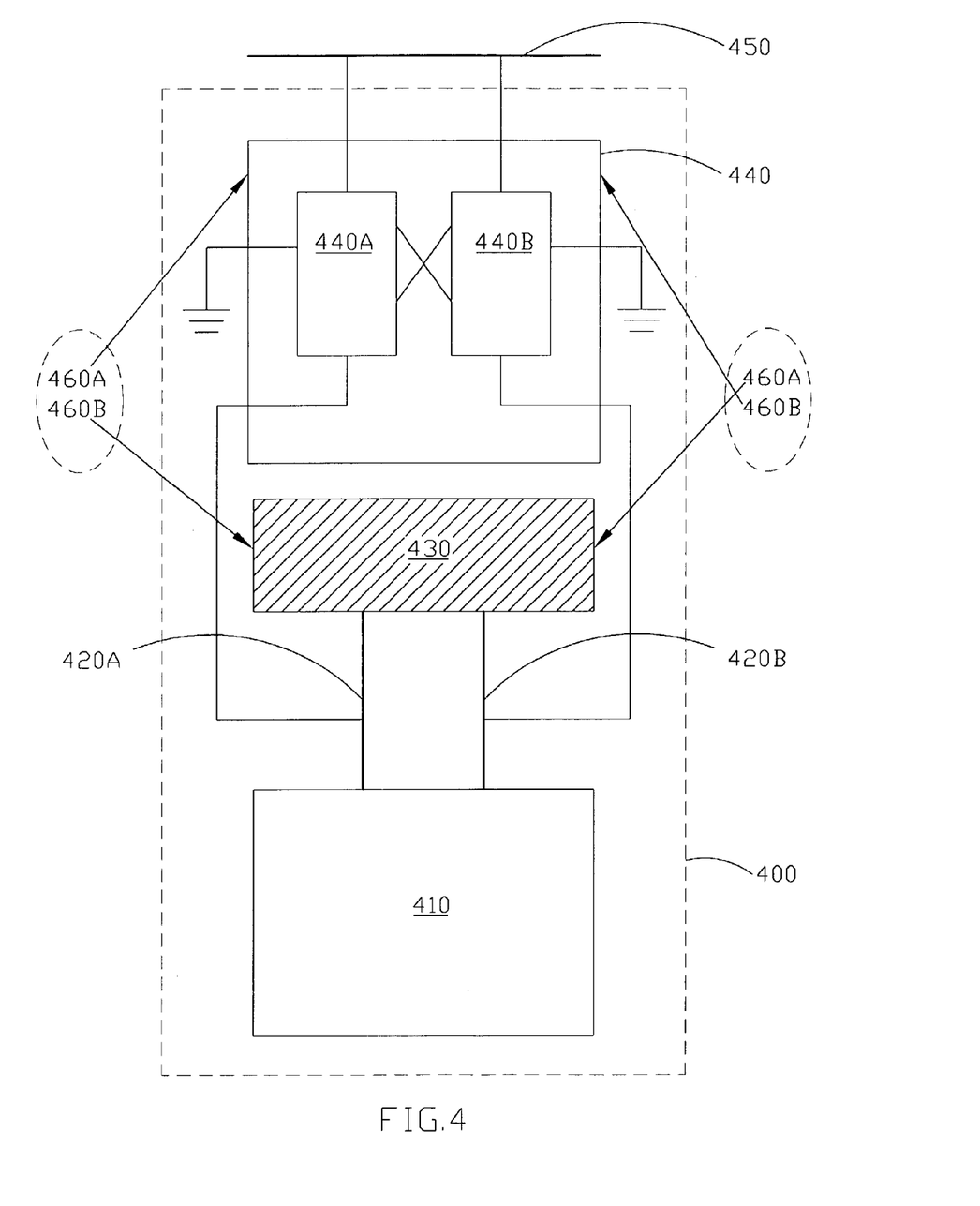
FIG. 4 shows a circuitry of the static random access memory system that can compensate the voltages of the bitlines by itself in accordance with the third embodiment of the present invention.

As illustrated in FIG. 4, in the third embodiment of the present invention, first of all, a static random access memory system 400 is provided. The static random access memory system 400 comprises: a memory cell region 410 that is individually coupled with a first bitline 420A and a second bitline 420B; a first sub-circuit 430 that is individually coupled with the first bitline 420A and the second bitline 420B to control these bitlines 420A/420B; a second sub-circuit 440 that is individually coupled with the first bitline 420A and the second bitline 420B between the memory cell region 410 and the first sub-circuit 430, wherein the second sub-circuit 440 consists of a first symmetric sub-circuit 440A and a second symmetric sub-circuit 440B, which are cross-coupled from each other, and each symmetric sub-circuit 440A/440B is coupled with each bitline 420A/420B between the memory cell region 410 and the first sub-circuit 430, individually. Furthermore, the second sub-circuit 440 can detect the differential voltage level between the bitlines 420A/420B by itself due to cross-couple scheme of the first symmetric sub-circuit 440A and the second symmetric sub-circuit 440B so as to compensate to Vcc of bitlines 420A/420B immediately. Moreover, each symmetric sub-circuit 440A/440B further comprises a plurality of MOSs, such as PMOS or NMOS, and they 440A/440B are individually coupled with a power 450 (Vcc) and the ground terminals by using the MOSs.

Referring to FIG. 4, in this embodiment, the first sub-circuit 430 and the second sub-circuit 440 individually and simultaneously communicate a pair of complementary signals 460 to perform a interaction, that is, when a first complemental signal 460A is coupled to enable the first sub-circuit 430, a second signal 460B is coupled to disable the second sub-circuit 440, and the memory cell region 410 attains to Vcc for operation; and further, when the second signal 460B is coupled to disable the first sub-circuit 430, the first signal 460A is simultaneously coupled to enable the second sub-circuit 440 to keep Vcc for operating the memory cell region 410.

Referring to FIG. 4, in this embodiment, the operation of the static random access memory system 400 is described as followings: first of all, the static random access memory system 400 enables the first sub-circuit 430 by the first complemental signal 460A to drive the bitlines 420A/420B and disable the second sub-circuit 440 by the second complemental signal 460B, so as to perform a pre-charge procedure and attain Vcc for operating the memory cell region 410. After the memory cell region 410 attains to Vcc, the static random access memory system 400 is coupled to disable the first sub-circuit 430 by the second complemental signal 460B to proceed with an access procedure, and that system 400 is coupled to enable the second sub-circuit 440 by the first complemental signal 460A to proceed with a compensation procedure, wherein that system 400 can control the pre-charge procedure and the compensation procedure by the interaction between the first sub-circuit 430 and the second sub-circuit 440. The compensation procedure is described as followings: when the voltage level of the second bitline 420B is abnormal, the first complemental signal 460A is coupled to disable the first symmetric sub-circuit 440A and enable the second symmetric sub-circuit 440B to electrify the power 450, so as to keep Vcc for operating the memory cell region 410 via the second bitline 420B; on the contrary, when the voltage level of the first bitline 420A is abnormal, the first complemental signal 460A is coupled to disable the second symmetric sub-circuit 440B and enable the first symmetric sub-circuit 440A to electrify the power 450, so as to keep Vcc for operating the memory cell region 410 via the first bitline 420A.

Figure 5:
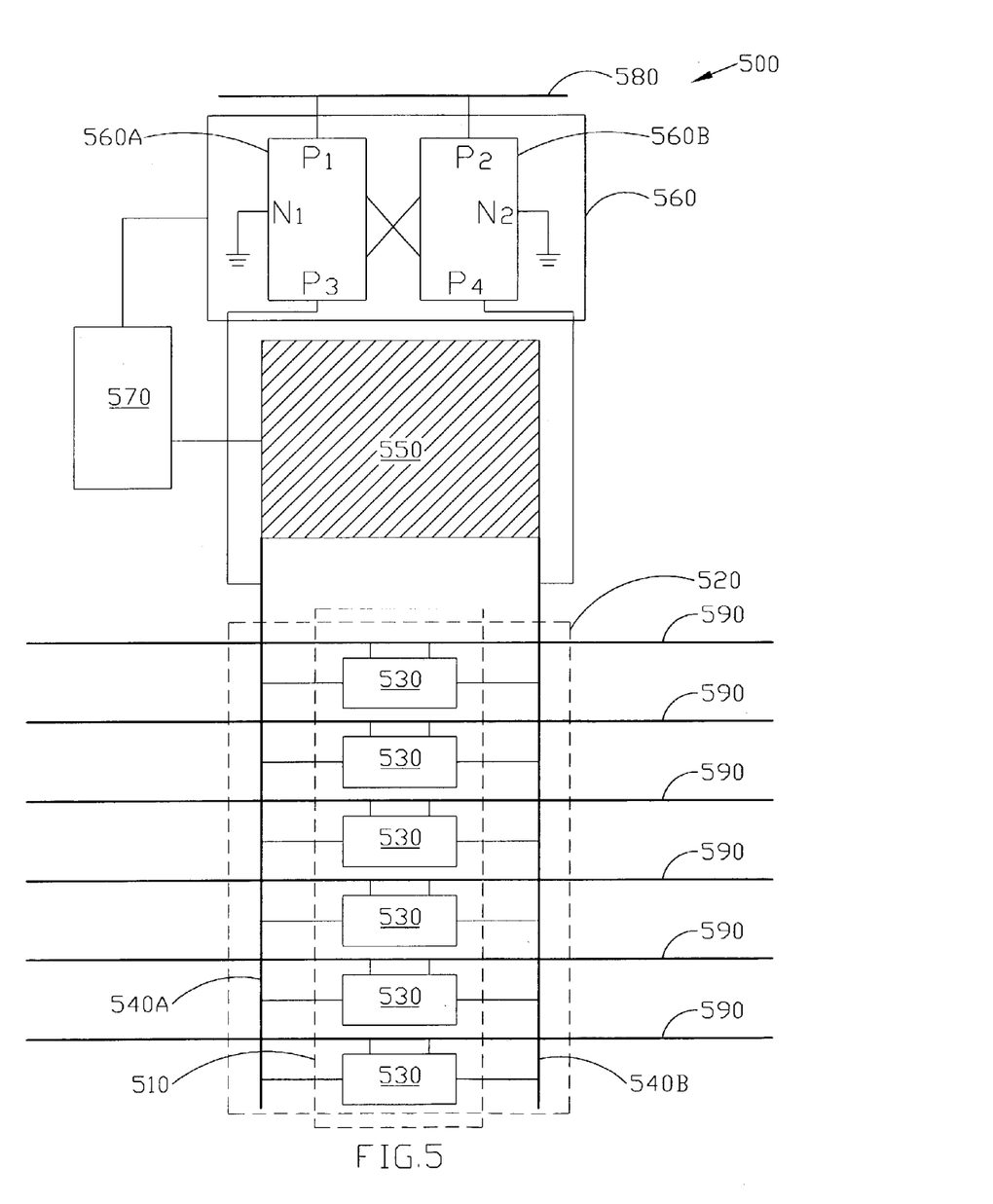
FIG. 5 shows a circuitry of the static random access memory system with a compensating-circuit in accordance with the fourth embodiment of the present invention.

As illustrated in FIG. 5, in the fourth embodiment of the present invention, first of all, a static random access memory system 500 is provided. The static random access memory system 500 comprises: a memory cell region 520 having at least one memory column 510, wherein at least one memory column 510 consists of a plurality memory cells 530 that are arranged in sequence therein; a first bitline 540A and a second bitline 540B that are individually coupled with the memory cells 530 of the memory column 510, wherein the same bitline 540A/540B is coupled with the same side of the memory column 510; a plurality of wordlines 590, wherein each wordline 590 is coupled with one of the memory cells 530, the first bitline 540A and the second bitline 540B; a bitline conditioning circuit 550 that is coupled with the first bitline 540A and the second bitline 540B, individually; a compensating-circuit 560 that is coupled with the first bitline 540A and the second bitline 540B, individually, between the memory cell region 520 and the bitline conditioning circuit 550; a control sub-circuit 570 that is individually the bitline conditioning circuit 550 and the compensating-circuit 560, the control sub-circuit 570 simultaneously communicates a pair of complemental signals to the bitline conditioning circuit 550 and the compensating-circuit 560 so as to control them 550/560 to perform a interaction thereof, wherein the pair of complemental signals include a first signal this is "ON" signal and a second signal that is "OFF" signal. The interaction is described as followings: when the control sub-circuit 570 communicates the first signal to enable the bitline conditioning circuit 550 and make the memory column 510 to Vcc for operation, the second signal is simultaneously communicated to disable the compensating-circuit 560; on the contrary, when the control sub-circuit 570 communicates the second signal to disable the bitline conditioning circuit 550, the first signal is simultaneously communicated to enable the compensating-circuit 560 so as to keep Vcc for operating the memory cells 530 in the memory column 510.

Referring to FIG. 5, in this embodiment, the compensating-circuit 560 comprises: a first symmetric sub-circuit 560A and a second symmetric sub-circuit 560B, which are cross-coupled from each other, and each symmetric sub-circuit 560A/560B is coupled with each bitline 540A/540B between the wordlines 590 and the bitline conditioning circuit 550, individually, wherein each symmetric sub-circuit 560A/560B further comprises a plurality of PMOSs and NMOSs; each symmetric sub-circuit 560A/560B is coupled with the power 580 by one of PMOSs P1/P2, and each that 560A/560B is individually coupled with each bitline 540A/540B by another of PMOSs P3/P4; and further, each that 560A/560B individually electrifies the ground terminal by one of NMOSs N1/N2.

Referring to FIG. 5, in this embodiment, the operation of the static random access memory system 500 is described as followings: first of all, the control sub-circuit 570 of the static random access memory system 500 communicates the first signal to enable the bitline conditioning circuit 550 so as to perform a pre-charge procedure and attain to Vcc for operating the memory column, and the second signal is simultaneously communicated to disable the compensating-circuit 560. After the memory column 510 attains to Vcc, the control sub-circuit 570 of the static random access memory system 500 communicates the second signal to disable the bitline conditioning circuit 550 so as to proceed with an access procedure. If one of the memory cells 510 is selected to perform the access procedure and other memory cells 510 are not selected, the wordline 590 coupled with the one of the memory cells 510 is enabled to proceed with the access procedure thereof. The control sub-circuit 570 of the static random access memory system 500 communicates the first signal to enable the compensating-circuit 560, so as to perform a compensation procedure during the access procedure, wherein that system 500 can control the pre-charge procedure and the compensation procedure by the interaction between the bitline conditioning circuit 550 and the compensating-circuit 560. The compensation procedure is described as followings: when the voltage level of the second bitline 540B is abnormal, the PMOS P3 of the first symmetric sub-circuit 560A couples to receive the first signal from the control sub-circuit 570 so as to disable that 560A and enable the power 580 via the PMOS P2 of the second symmetric sub-circuit 560B to supply Vcc to the second bitline 540B from the PMOS P4 of that 560B, whereby the memory cells 530 of the memory column 510 can keep Vcc for operation; on the contrary, when the voltage level of the first bitline 540A is abnormal, the PMOS P4 of the second symmetric sub-circuit 560B couples to receive the first signal from the control sub-circuit 570 so as to disable that 560B and enable the power 580 via the PMOS P1 of the first symmetric sub-circuit 560A to supply Vcc to the first bitline 540A from the PMOS P3 of that 560A, whereby the memory cells 530 of the memory column 510 can keep Vcc for operation.

Figure 6:
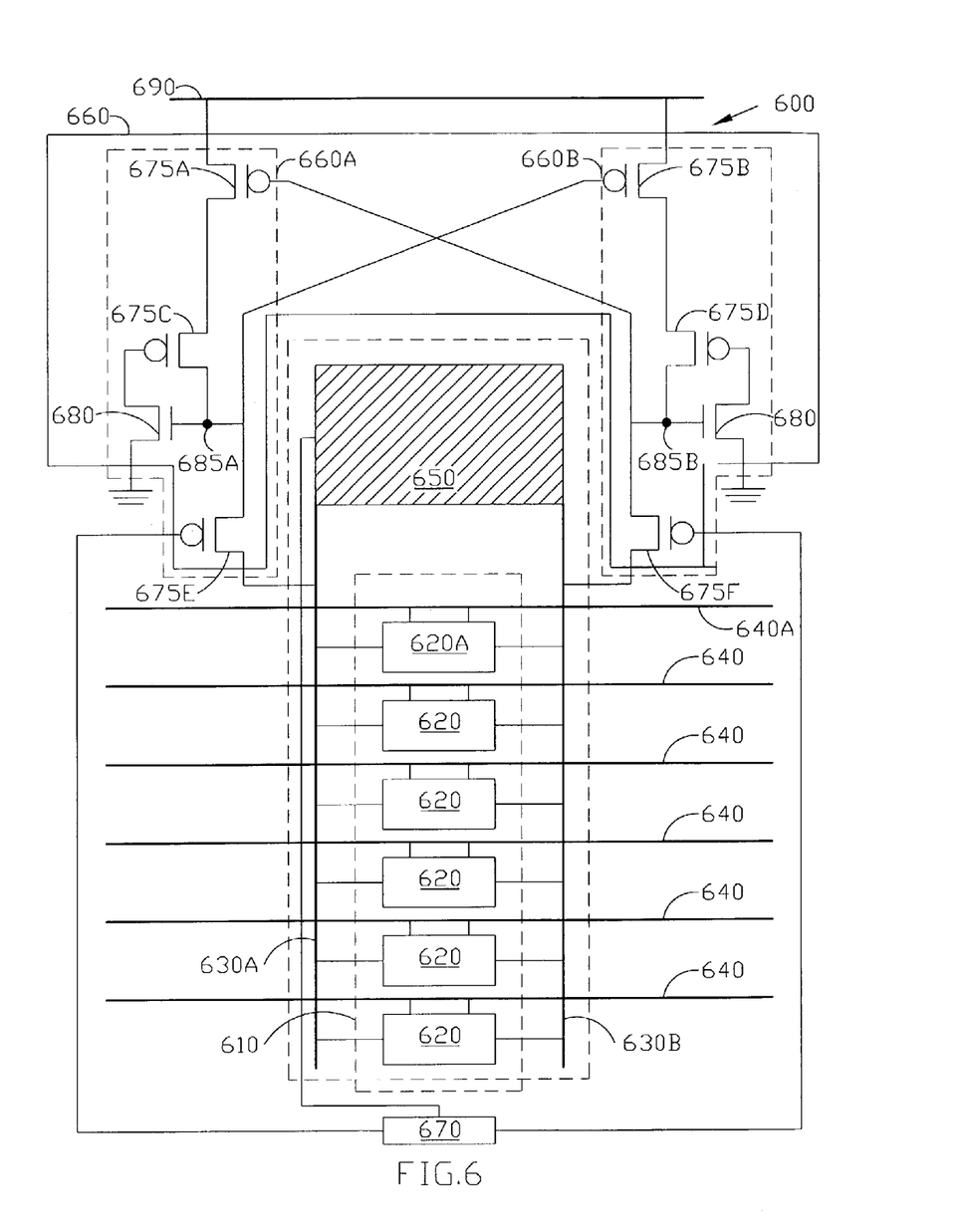
FIG. 6 shows a circuitry of the static random access memory system with a compensating-circuit in accordance with the fifth embodiment of the present invention.

As illustrated in FIG. 6, in the fifth embodiment of the present invention, first of all, a static random access memory system 600 is provided. The static random access memory system 600 comprises: a memory cell region having a memory column 610, wherein the memory column 610 consists of a plurality memory cells 620 that are arranged in sequence therein; a first bitline 630A and a second bitline 630B that are individually coupled with the memory cells 620 of the memory column 610, wherein the same bitline 630A/630B is coupled with the same side of the memory column 610; a plurality of wordlines 640, wherein each wordline 640 is coupled with each memory cell 620 of the memory column 610, the first bitline 630A and the second bitline 630B; a bitline conditioning circuit 650 that is coupled with the first bitline 630A and the second bitline 630B, individually; a compensating-circuit 660 that is coupled with the first bitline 630A and the second bitline 630B, individually, between a first wordline 640A of the wordlines 640 and the bitline conditioning circuit 650; a control sub-circuit 670 that is individually coupled with the bitline conditioning circuit 650 and the compensating-circuit 660, the control sub-circuit 670 simultaneously communicates a pair of complemental signals to the bitline conditioning circuit 650 and the compensating-circuit 660 so as to perform a interaction, wherein the pair of complemental signals include a first signal this is "ON" signal and a second signal that is "OFF" signal.

Referring to FIG. 6, in this embodiment, the compensating-circuit 660 comprises: a first PMOS device 675A and a second PMOS device 675B whose sources are coupled with a power 690; a third PMOS device 675C and a fourth PMOS device 675D, the sources of the third PMOS device 675C is coupled with the drain of the first PMOS device 675A and the sources of the fourth PMOS device 675D is coupled with the drain of the second PMOS device 675B; a first NMOS device 680A whose drain is coupled with the gate of the third PMOS device 675C and source electrifies the ground terminal and gate is coupled with the drain of the third PMOS device 675C to form a first node 685A; a second NMOS device 680B whose drain is coupled with the gate of the fourth PMOS device 675D and source electrifies the ground terminal and gate is coupled with the drain of the fourth PMOS device 675D to form a second node 685B; a fifth PMOS device 675E whose source is coupled with the gate of the second PMOS device 675B on the first node 685A and drain is coupled with the first bitline 630A between the first wordline 640A and the bitline conditioning circuit 650; a sixth PMOS device 675F whose source is coupled with the gate of the first PMOS device 675A on the second node 685B and drain is coupled with the second bitline 630B between the first wordline 640A and the bitline conditioning circuit 650. Furthermore, the first PMOS device 675A, the third PMOS device 675C, the fifth PMOS device 675E, the first NMOS device 680A and the first node 685A construct a first symmetric sub-circuit 660A, and the second PMOS device 675B, the fourth PMOS device 675D, the sixth PMOS device 675F, the second NMOS device 680B and the second node 685B construct a second symmetric sub-circuit 660B.

Referring to FIG. 6, in this embodiment, the operation of the static random access memory system 600 is described as followings: first of all, the control sub-circuit 670 communicates the first signal to enable the bitline conditioning circuit 650 so as to perform a pre-charge procedure for the memory cells 620 of the memory column 610, and the second signal is simultaneously communicated to disable the compensating-circuit 660, wherein the second state, such as "0" signal, located on the second bitline 630B are lower than the first state, such as "1" signal, located on the first bitline 630A in all memory cells 620 when the memory cells 620 attain to Vcc. After memory cells attain to Vcc, the control sub-circuit 670 communicates the second signal to disable the bitline conditioning circuit 650. If the first wordline 640A coupled with the first memory cells 620A is selected to perform the access procedure and other wordlines 640 coupled with other memory cells 620 are not selected, the first wordline 640A is enabled to make the second state of the first memory cell 620A, such as "1" signal, located on the second bitline 630B higher than that of other memory cells 620, such as "0" signal, and then the first state of the first memory cell 620A, such as "0" signal, located on the first bitline 630A lower than that of other memory cells 620, such as "1" signal. When the voltage level of the second state in the first memory cell 620A is abnormal, that is, "1" signal tends to become "0" signal due to the leakage, the control sub-circuit 670 enable the compensating-circuit 660 by communicating the first signal to perform a compensation procedure, and the first signal is simultaneously communicated to the gates of the fifth PMOS device 675E and the sixth PMOS device 675F, wherein the fifth PMOS device 675E couple to enable the second PMOS device 675B so that Vcc is guided into the second bitline 630B from the power 690 via the second PMOS device 675B, the fourth PMOS device 675D, the second node 685B and the sixth PMOS device 675F in sequence so as to keep the second state of the first memory cell 620A being higher than that of other memory cells 620, whereby Vcc for operating the first memory cell 620A during the access procedure can be maintained for avoiding the bitlines 630A/630B decayed as time going on resulted from serious leakage problems.

Due to process technology progresses, such as gate oxide thickness and gate length of transistors requirements of advanced process induced a complicated and difficult leakage problem such as standby current issue. For these leakage problems in the SRAM, the conventional method provides that a memory system having memory cells wherein pass transistors have lower threshold voltages (Vt) than do latch transistors, and wherein wordlines for non-selected memory cells are underdriven to reduce leakage in bitlines. But it needs to satisfy the requirement of the process and to modify. Therefore, this invention utilizes a leakage-compensation circuit to solve these leakage problems from a circuitry point of view. According to this invention, in the precharge operation, one of the complementary signals coupled into the bitline conditioning circuit is ON to precharge Vcc into the bitlines, and the other of the complementary signals coupled into the compensation circuit is OFF to be disabled. On the contrary, in the access operation, one of the complementary signals coupled into the compensation circuit is ON to be enabled, and the other of the complementary signals coupled into the bitline conditioning circuit is OFF to be disabled. When the signal of the worldline for the selected memory cell is ON, in the beginning, the bitlines are tri-state at Vcc. In the conventional SRAM, one of the bitlines will be decayed as time going on due to serious leakage problem, but this leakage problem is avoided by the leakage-compensation scheme of the present invention. Furthermore, the leakage-compensation circuit itself will detect the differential voltage level of bitlines due to cross-couple scheme, and compensate the voltage level of bitlines immediately. These embodiments of the present invention described as above, when the abnormal voltage level of bitlines is detected, and one of the symmetric sub-circuits in the leakage-compensation circuit compensates to Vcc immediately.

In these embodiments of the present invention, as discussed above, this invention can utilize a compensating-circuit to maintain Vcc for operating SRAM during the access procedure. Of course, it is possible to apply the circuitry scheme concerning SRAM system, and it is also possible for the present invention to be applied to the circuitry scheme in any memory system. Furthermore, at the present time, this invention that schemes a compensating-circuit to solve these leakage problems from a circuitry point of view has not been developed to apply the subject matter concerning preventing the leakage in the memory system.

Therefore, the method of the present invention is the best method for avoiding the leakage on bitlines for deep submicron circuitry scheme.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A static random access memory system, the static random access memory system comprising:
   a memory cell region, said memory cell region is individually coupled with a first bitline and a second bitline;
   a first sub-circuit, said first sub-circuit is individually coupled with said first bitline and said second bitline; and
   a second sub-circuit, said second sub-circuit is individually coupled with said first bitline and said second bitline between said memory cell region and said first sub-circuit, wherein said first sub-circuit and said second sub-circuit individually and simultaneously communicate a first complemental signal and a second complemental signal to perform an interaction so as to attain and maintain a voltage for operating said memory cell region, and said second sub-circuit comprises a first symmetric sub-circuit and a second symmetric sub-circuit; wherein said first symmetric sub-circuit is coupled with said first bitline between said memory cell region and said first sub-circuit; and said second symmetric sub-circuit is coupled with said second bitline between said memory cell region and said first sub-circuit, wherein said second symmetric sub-circuit and said first symmetric sub-circuit are cross-coupled from each other, whereby said second sub-circuit can detect the differential voltage level between said first bitline and said second bitline by itself so as to compensate to said voltage immediately.

2. The static random access memory system according to claim 1, wherein said each symmetric sub-circuit comprises a plurality of MOSs that are used to couple with a power and the ground terminals.

3. The static random access memory system according to claim 2, when the voltage level of said second bitline is abnormal, wherein said first complemental signal is coupled to disable said first symmetric sub-circuit and enable said second symmetric sub-circuit to electrify said power, so as to maintain said voltage for operating said memory cell region via said second bitline.

4. The static random access memory system according to claim 2, when the voltage level of said first bitline is abnormal, wherein said first complemental signal is coupled to disable said second symmetric sub-circuit and enable said first symmetric sub-circuit to electrify said power, so as to maintain said voltage for operating said memory cell region via said first bitline.

5. The static random access memory system according to claim 2, wherein said interaction comprises:
   said first complemental signal is coupled to enable said first sub-circuit, and said second complemental signal is simultaneously coupled to disable said second sub-circuit; and
   said second complemental signal is coupled to disable said first sub-circuit, and said first complemental signal is simultaneously coupled to enable said second sub-circuit.

6. The static random access memory system according to claim 1, wherein the operation of the static random access memory system comprises:
   enabling said first sub-circuit in accordance with said interaction to drive said first bitline and said second bitline to perform a pre-charge procedure, so as to attain said voltage in said memory cell region;
   disabling said first sub-circuit in accordance with said interaction to proceed with an access procedure; and
   enabling said second sub-circuit in accordance with said interaction to perform a compensation procedure and maintain said voltage for operating said memory cell region.

7. A static random access memory system, the static random access memory system comprising:
   a memory cell region having at least one memory column, wherein said at least one memory column consists of a plurality of memory cells that are arranged in sequence therein;
   a first bitline and a second bitline, said first bitline and said second bitline are individually coupled with said plurality memory cells of said memory column;
   a plurality of wordlines, wherein said each wordline is coupled with one of said plurality of memory cells, said first bitline and said second bitline;
   a bitline conditioning circuit, said bitline conditioning circuit is coupled with said first bitline and said second bitline, individually;
   a compensating-circuit, said compensating-circuit is coupled with said first bitline and said second bitline, individually, between said memory cell region and said bitline conditioning circuit; and
   a control sub-circuit, said control sub-circuit is individually said bitline conditioning circuit and said compensating-circuit, and said control sub-circuit simultaneously communicates a pair of complemental signals with a first signal and a second signal to said bitline conditioning circuit and said compensating-circuit so as to perform a interaction and attain said voltage in said memory cell region and maintain said voltage for operating said memory cell region;
   wherein said compensating-circuit comprises:
      a first symmetric sub-circuit, said first symmetric sub-circuit is coupled with said first bitline between said plurality of wordlines and said first sub-circuit; and
      a second symmetric sub-circuit, said second symmetric sub-circuit is coupled with said second bitline between said plurality of wordline and said first sub-circuit, wherein said second symmetric sub-circuit and said first symmetric sub-circuit are cross-coupled from each other.

8. The static random access memory system according to claim 7, wherein said each symmetric sub-circuit comprises:
   a first MOS device, said each symmetric sub-circuit is coupled with a power by using said first MOS;
   a second MOS device, said first symmetric sub-circuit is coupled with said first bitline by using said second MOS device and said second symmetric sub-circuit is coupled with said second bitline by using said second MOS; and
   a third MOS device, said each symmetric sub-circuit electrifies the ground terminal by using said third MOS device.

9. The static random access memory system according to claim 8, when the voltage level of said second bitline is abnormal, wherein said control sub-circuit communicates said first signal to said second MOS device to disable said first symmetric sub-circuit and enable said second symmetric sub-circuit to electrify said power via said first MOS device, so as to apply said voltage to said second bitline and maintain said voltage for operating said memory cell region.

10. The static random access memory system according to claim 8, when the voltage level of said first bitline is abnormal, wherein said control sub-circuit communicates said first signal to said second MOS device to disable said second symmetric sub-circuit and enable said first symmetric sub-circuit to electrify said power via said first MOS device, so as to apply said voltage to said first bitline and maintain said voltage for operating said memory cell region.

11. The static random access memory system according to claim 7, wherein said interaction comprises:
    said control sub-circuit simultaneously communicates said first signal to enable said bitline conditioning circuit and said second signal to disable said compensating-circuit; and
    said control sub-circuit simultaneously communicates said second signal to disable said bitline conditioning circuit and said first signal to enable said compensating-circuit.

12. The static random access memory system according to claim 7, wherein the operation of the static random access memory system comprises:
    enabling said bitline conditioning circuit by said control sub-circuit in accordance with said interaction to perform a pre-charge procedure, so as to attain said voltage in said memory column;
    disabling said bitline conditioning circuit by said control sub-circuit in accordance with said interaction to proceed with an access procedure; and
    enabling said compensating-circuit by said control sub-circuit in accordance with said interaction to perform a compensation procedure.

13. A static random access memory system, the static random access memory system comprising:
    a memory cell region having a memory column, wherein said memory column consists of a plurality memory cells that are arranged in sequence therein;
    a first bitline and a second bitline, said first bitline and said second bitline are individually coupled with said plurality memory cells of said memory column, wherein said first bitline and said second bitline are individually coupled with two sides of said memory column;
    a plurality of wordlines, said each wordline is coupled with said each memory cell of said memory column, said first bitline and said second bitline;
    a bitline conditioning circuit, said bitline conditioning circuit is coupled with said first bitline and said second bitline, individually;
    a compensating-circuit, said compensating-circuit is coupled with said first bitline and said second bitline, individually, between said plurality of wordlines and said bitline conditioning circuit; and
    a control sub-circuit, said control sub-circuit is individually coupled with said bitline conditioning circuit and said compensating-circuit, and said control sub-circuit simultaneously communicates a pair of complemental signals having a first signal and a second signal to said bitline conditioning circuit and said compensating-circuit so as to perform a interaction;
    wherein said compensating-circuit comprises:
        a first PMOS device, the source of said first PMOS device is coupled with a power;
        a second PMOS device, the source of said second PMOS device is coupled with said power;
        a third PMOS device, the sources of said third PMOS device is coupled with the drain of said first PMOS device;
        a fourth PMOS device, the sources of said fourth PMOS device is coupled with the drain of said second PMOS device;
        a first NMOS device, the drain of said first NMOS device is coupled with the gate of said third PMOS device, and the source of said first NMOS device is coupled to electrify the ground terminal, wherein the gate of said first NMOS device is coupled with the drain of said third PMOS device to form a first node;
        a second NMOS device, the drain of said second NMOS device is coupled with the gate of the fourth PMOS device, and source of said second NMOS device electrifies the ground terminal, wherein the gate of said second NMOS device is coupled with the drain of said fourth PMOS device to form a second node;
        a fifth PMOS device, the source of said fifth PMOS device is coupled with the gate of said second PMOS device on said first node, and the drain of said fifth PMOS device is coupled with said first bitline between said plurality of wordlines and said bitline conditioning circuit; and
        a sixth PMOS device, the source of said sixth PMOS device is coupled with the gate of said first PMOS device on said second node, and the drain of said sixth PMOS device is coupled with said second bitline between said plurality of wordlines and said bitline conditioning circuit.

14. The static random access memory system according to claim 13, wherein said control sub-circuit communicates said first signal to the gates of said fifth PMOS device and said sixth PMOS device so as to enable said compensating-circuit.

15. The static random access memory system according to claim 14, wherein said second PMOS device is enabled by said fifth PMOS to guide the voltage into said second bitline from said power via said second PMOS device, said fourth PMOS device, said second node and said sixth PMOS device in sequence, so as to maintain the voltage for operating said plurality of memory cells in the access procedure of the static random access memory system.

16. The static random access memory system according to claim 13, wherein said control sub-circuit simultaneously communicates said first signal to enable said bitline conditioning circuit during the pre-charge procedure of the static random access memory system and said second signal to disable said compensating-circuit so as to apply the voltage for operating said plurality of memory cells in the access procedure of the static random access memory system.

17. The static random access memory system according to claim 13, wherein said control sub-circuit simultaneously communicates said second signal to disable said bitline conditioning circuit and said first signal to enable said compensating-circuit during the access procedure of the static random access memory system, so as to perform the compensation procedure and maintain the voltage for operating said plurality of memory cells in the access procedure of the static random access memory system.

* * * * *